United States Patent
Settlemyer, Jr. et al.

(10) Patent No.: US 7,101,768 B2
(45) Date of Patent: Sep. 5, 2006

(54) SELF-ALIGNED SELECTIVE HEMISPHERICAL GRAIN DEPOSITION PROCESS AND STRUCTURE FOR ENHANCED CAPACITANCE TRENCH CAPACITOR

(75) Inventors: Kenneth T. Settlemyer, Jr., Poughquag, NY (US); Porshia Shane Wrschka, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/260,053

(22) Filed: Sep. 27, 2002

(65) Prior Publication Data

US 2004/0063297 A1 Apr. 1, 2004

(51) Int. Cl.
*H01L 21/20* (2006.01)
(52) U.S. Cl. .............. 438/388; 438/243; 438/245; 438/386
(58) Field of Classification Search .......... 438/243, 438/244, 245, 255, 256, 386, 387, 388, 398, 438/399, 964, 213, 378, FOR. 488, 791–794; 257/E27.091, E27.092, E27.095
See application file for complete search history.

(56) References Cited

U.S. PATENT DOCUMENTS

| | | | |
|---|---|---|---|
| 5,330,936 A * | 7/1994 | Ishitani | 438/791 |
| 5,996,612 A | 10/1996 | Wu | 438/398 |
| 6,008,104 A * | 12/1999 | Schrems | 438/386 |
| 6,124,161 A | 9/2000 | Chern et al. | 438/238 |
| 6,159,874 A * | 12/2000 | Tews et al. | 438/253 |
| 6,174,770 B1 * | 1/2001 | Chi | 438/255 |
| 6,187,631 B1 * | 2/2001 | Harshfield | 438/255 |
| 6,204,117 B1 | 3/2001 | Chiou et al. | 438/253 |
| 6,455,369 B1 * | 9/2002 | Forster et al. | 438/249 |
| 6,534,376 B1 | 3/2003 | Tews | 438/386 |
| 6,723,611 B1 | 4/2004 | Akatsu et al. | 438/386 |
| 2003/0064591 A1 * | 4/2003 | Lutzen et al. | 438/689 |

* cited by examiner

*Primary Examiner*—George Fourson
*Assistant Examiner*—Julio Maldonado
(74) *Attorney, Agent, or Firm*—Daryl K. Neff; Joseph P. Abate

(57) ABSTRACT

As disclosed herein, a method is provided, in an integrated circuit, for forming an enhanced capacitance trench capacitor. The method includes forming a trench in a semiconductor substrate and forming an isolation collar on a sidewall of the trench. The collar has at least an exposed layer of oxide and occupies only a "collar" portion of the sidewall, while a "capacitor" portion of the sidewall is free of the collar. A seeding layer is then selectively deposited on the capacitor portion of the sidewall. Then, hemispherical silicon grains are deposited on the seeding layer on the capacitor portion of the sidewall. A dielectric material is deposited, and then a conductor material, in that order, over the hemispherical silicon grains on the capacitor portion of the sidewall.

11 Claims, 1 Drawing Sheet

US 7,101,768 B2

SELF-ALIGNED SELECTIVE HEMISPHERICAL GRAIN DEPOSITION PROCESS AND STRUCTURE FOR ENHANCED CAPACITANCE TRENCH CAPACITOR

FIELD OF THE INVENTION

The invention relates to a semiconductor processing method and structure, and more particularly to a integrated circuit fabrication process and structure for capacitance enhancement of a trench capacitor structure, such as useful in a dynamic random access memory (DRAM), among others.

BACKGROUND OF THE INVENTION

In a dynamic random access memory (DRAM), a plurality of memory cells are formed in a matrix manner on a substrate. Each memory cell in a DRAM device is constructed by at least one transistor and at least one storage capacitor. Commonly, either trench capacitor or stacked cells are used. The trenched structure is advantageous to the stacked structure in situations where the surface flatness of the device is of great importance. While trench capacitors are mostly used as storage capacitors in DRAMS, such structures are also used in some integrated circuits as general use capacitors, for example for decoupling purposes.

In DRAMs, as well as in other integrated circuits, it is desirable that a semiconductor chip hold as many circuits or memory cells as possible per unit area. The continuing trend to increase circuit density requires that DRAM cells occupy smaller and smaller areas over the long term. However, the inability to shrink cell voltages and currents as rapidly as the cell area means that proportionally more capacitance is demanded from the storage capacitor per unit of area defined by the initial etch of the trench at critical dimension. Thus, a need exists for a method of forming a trench storage capacitor having enhanced capacitance.

SUMMARY OF THE INVENTION

The present invention provides a way of increasing the amount of surface area available between plates of a trench storage capacitor by forming an uneven plate surface by deposited hemispherical silicon grains, and then forming the capacitor dielectric and a conductor on the other side of the dielectric.

Accordingly, a method is provided, in an integrated circuit, for forming an enhanced capacitance trench capacitor. The method includes forming a trench in a semiconductor substrate and forming an isolation collar on a sidewall of the trench. The collar has at least an exposed layer of oxide and occupies only a "collar" portion of the sidewall, while a "capacitor" portion of the sidewall is free of the collar. A seeding layer is then selectively deposited on the capacitor portion of the sidewall. Then, hemispherical silicon grains are deposited on the seeding layer on the capacitor portion of the sidewall. A dielectric material is deposited, and then a conductor material, in that order, over the hemispherical silicon grains on the capacitor portion of the sidewall.

DETAILED DESCRIPTION OF THE PREFERRED EMBODIMENTS

Figure 1:
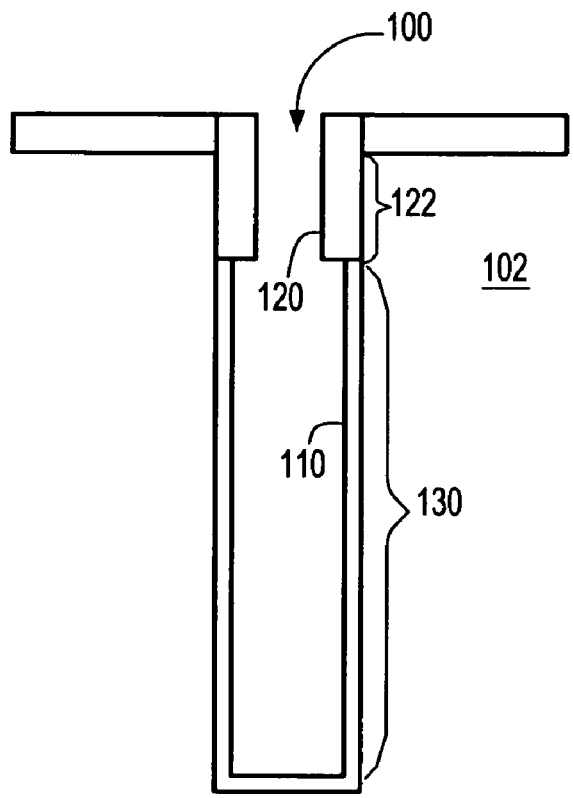
FIG. 1 is an illustration of the a thin nitride layer deposition as provided by one embodiment of the present invention.

One way to increase the surface area available as the dielectric interface between plates of a capacitor is to provide a plate having an uneven surface, and then depositing a compatible dielectric material over it, such that the dielectric material generally assumes the unevenness of the plate surface below that.

Depositing hemispherical silicon grains (hereinafter, "HSG") onto sidewalls of a deep trench may be a way to create an uneven surface, and thereby increase the surface area of a trench capacitor. However, at small groundrules of 110 nanometers and below, HSG deposition in the context of existing trench capacitor processing appears problematic. For example, depositing HSG into deep trenches after forming the isolation collar could fail due to HSG adhering to the collar and pinching off the trench, causing few grains to be deposited in the bottom of the trench. Therefore, it becomes imperative to use a selective HSG process such that grains are deposited in a lower portion of the trench, while relatively few, if any, grains are deposited on the collar. In accordance with the method described below, the selective deposition of HSG eliminates a hard requirement of removing grains from the collar prior to depositing a node conductor.

For example, in an embodiment, a deep trench 100 is formed in a substrate 102. Thereafter, an isolation collar 120 is formed in an upper portion 122 of the deep trench 100, leaving the lower portion 130 free of the collar. The collar comprises at least an outer layer of oxide, but can be formed entirely of an oxide. A seeding layer 110 is then preferentially deposited on the sidewall in the lower portion 130 of the deep trench 100. The seeding layer preferably comprises a thin layer of silicon nitride, between about 5 and 12 521 in thickness. The seeding layer is preferentially deposited on the silicon sidewalls in the lower portion 130 of the deep trench. Very little seeding material adheres to the sidewall of isolation collar 120.

Figure 2:
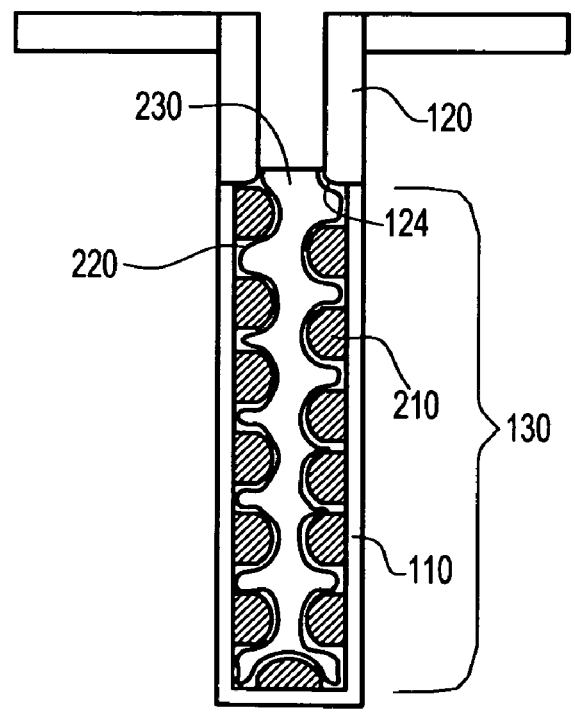
FIG. 2 is an illustration of a hemispherical grain polysilicon (HSG) seeding as provided by one embodiment of the present invention.

Next, as shown in FIG. 2, hemispherical silicon grains (HSG) 210 are selectively deposited, from a source of amorphous silicon, onto the seeding layer 110 which is present in the lower portion 130 of the deep trench 100. Very little HSG, if any, is deposited onto the collar 120 because of the absence of a seeding layer 110 or an otherwise suitable surface on which they can adhere. One way of selectively depositing HSG onto a seeding layer of silicon nitride, resulting in little deposition onto an oxide surface, is by a low pressure chemical vapor deposition at a temperature below 650° C. Next, although not a strict process-enabling requirement, if there is residual HSG adhering to the collar 120, it can then be removed, as for example, with an etch, such as a wet etch, or other similar methods, as known to those skilled in the art. If an isotropic wet etch is used, the HSG grain size in the lower portion 130 of the trench may be reduced slightly, but still be satisfactory within the context of this method. Such etch can be performed, or omitted, as necessary, depending upon the amount of for a particular process, to prevent unwanted conduction and/or parasitic effects of leaving some conductive material between the isolation collar and the subsequently deposited capacitor dielectric 220. Note that the method described herein results in the HSG enhancement of the trench capacitor in a lower portion 130 being self-aligned to the bottom 124 of the isolation collar 120. Next, a capacitor dielectric 220 is deposited over the HSG 210 and a material such as highly doped polysilicon, a metal or a metal silicide is deposited and recessed in the trench to form a conductor 230, thus forming a trench capacitor in the lower portion 130.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of forming an enhanced capacitance trench capacitor, comprising:
    forming a trench in a semiconductor substrate;
    forming an isolation collar on a sidewall of said trench having at least an exposed layer of oxide, said isolation collar occupying only a collar portion of said sidewall;
    providing a capacitor portion of said sidewall of said trench below said isolation collar, said capacitor portion self-aligned to a bottom of said isolation collar;
    selectively depositing a seeding layer including silicon nitride on said capacitor portion of said sidewall to self-align said seeding layer to said bottom of said isolation collar;
    selectively depositing hemispherical silicon grains on said seeding layer to form a hemispherical silicon grain covered region of said trench sidewall self-aligned to said bottom of said isolation collar; and
    depositing a capacitor dielectric material and another material in order, over said hemispherical silicon grains, the another material including at least one of doped polysilicon, metal and metal silicide, to form said enhanced capacitance trench capacitor self-aligned to said bottom of said isolation collar.

2. The method of claim 1, wherein said isolation collar is formed by depositing one or more layers including said exposed layer of oxide and clearing said one or more deposited layers from said capacitor portion of said sidewall.

3. The method of claim 1, wherein said capacitor portion comprises a lower portion of said sidewall and a bottom of said trench and said collar portion comprises an upper portion of said sidewall above said lower portion.

4. A method of forming an enhanced capacitance trench storage capacitor for a memory cell of a dynamic random access memory, comprising:
    forming a trench in a semiconductor substrate;
    forming an isolation collar on a sidewall of said trench having at least an exposed layer of oxide, said isolation collar occupying only a collar portion of said sidewall;
    providing a capacitor portion of said sidewall of said trench below said isolation collar, said capacitor portion being self-aligned to a bottom of said isolation collar;
    selectively depositing a seeding layer including silicon nitride on said capacitor portion of said sidewall to self-align said seeding layer to said bottom of said isolation collar;
    selectively depositing hemispherical silicon grains on said seeding layer to form a hemispherical silicon grain covered region of said trench sidewall self-aligned to said bottom of said isolation collar; and
    depositing a node dielectric material and a node conductor material, in order, over said hemispherical silicon grains, the node conductor material including at least one of doped polysilicon, metal and metal silicide, to form said enhanced capacitance trench capacitor self-aligned to said bottom of said isolation collar.

5. The method of claim 4, wherein said isolation collar is formed by depositing one or more layers including said exposed layer of oxide and clearing said one or more deposited layers from said capacitor portion of said sidewall.

6. The method of claim 4, wherein said capacitor portion comprises a lower portion of said sidewall and a bottom of said trench and said collar portion comprises an upper portion of said sidewall above said lower portion.

7. The method of claim 4, wherein said isolation collar consists entirely of an oxide material.

8. The method of claim 4, wherein said hemispherical grains are deposited by low pressure chemical vapor deposition.

9. The method of claim 8, wherein said low pressure chemical deposition is conducted at a temperature below 650° C.

10. The method of claim 4 further comprising removing said deposited hemispherical silicon grains from said isolation collar by wet etching.

11. A method of forming an enhanced capacitance trench capacitor comprising:
    forming a trench having a sidewall in a substrate including a single-crystal semiconductor, said single-crystal semiconductor being exposed along said sidewall;
    forming an isolation collar along a collar portion of said sidewall, said isolation collar having at least an exposed layer of oxide;
    exposing said single-crystal semiconductor in a capacitor portion of said sidewall self-aligned to a bottom of said isolation collar;
    selectively depositing a seeding layer including silicon nitride on said exposed single-crystal semiconductor along said capacitor portion of said sidewall to self-align said seeding layer to said bottom of said isolation collar;
    selectively depositing hemispherical silicon grains on said seeding layer to form a hemispherical silicon grain covered region of said trench sidewall self-aligned to said bottom of said isolation collar; and
    depositing a capacitor dielectric material and another material, in order, over said hemispherical silicon grains, the another material including at least one of doped polysilicon, metal and metal silicide, to form said enhanced capacitance trench capacitor self-aligned to said bottom of said isolation collar.

* * * * *